US007942687B1

(12) United States Patent
Werner et al.

(10) Patent No.: US 7,942,687 B1
(45) Date of Patent: May 17, 2011

(54) HOLLOW STEM DESIGN FOR HIGH DENSITY INTERCONNECTS

(75) Inventors: Walter V. Werner, Pittsford, NY (US); Earl W. Stromberg, Roanoke, TX (US); Wit Cezary Bushko, Medway, MA (US); George Hanna Ghanime, Ballston Spa, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/881,379

(22) Filed: Sep. 14, 2010

(51) Int. Cl.
*H01R 25/00* (2006.01)
(52) U.S. Cl. ......................................................... 439/291
(58) Field of Classification Search .................... 439/78, 439/74, 79, 66, 81–84, 76.1, 291
See application file for complete search history.

(56) References Cited

U.S. PATENT DOCUMENTS

| | | | | | |
|---|---|---|---|---|---|
| 3,314,044 | A | * | 4/1967 | Powell | 439/851 |
| 3,526,867 | A | * | 9/1970 | Keeler | 439/74 |
| 5,299,939 | A | * | 4/1994 | Walker et al. | 439/74 |
| 5,774,341 | A | | 6/1998 | Urbish et al. | |
| RE36,442 | E | * | 12/1999 | Kardos | 324/756.05 |
| 7,014,473 | B2 | * | 3/2006 | Millard et al. | 439/66 |
| 7,323,787 | B2 | | 1/2008 | Chan | |
| 7,382,142 | B2 | | 6/2008 | Chong et al. | |
| 7,393,214 | B2 | * | 7/2008 | DiStefano | 439/66 |
| 7,491,069 | B1 | * | 2/2009 | Di Stefano et al. | 439/74 |
| 7,559,700 | B2 | * | 7/2009 | Eguchi et al. | 385/70 |
| 7,559,770 | B2 | * | 7/2009 | Di Stefano | 439/66 |
| 7,579,848 | B2 | | 8/2009 | Bottoms et al. | |
| 7,837,476 | B2 | * | 11/2010 | Di Stefano | 439/66 |
| 2010/0022105 | A1 | * | 1/2010 | Di Stefano | 439/66 |
| 2010/0075547 | A1 | * | 3/2010 | Lin et al. | 439/857 |
| 2010/0105220 | A1 | * | 4/2010 | Di Stefano | 439/66 |
| 2010/0159753 | A1 | * | 6/2010 | Hsu et al. | 439/786 |
| 2010/0273364 | A1 | * | 10/2010 | Di Stefano | 439/750 |

OTHER PUBLICATIONS

"3M Dual Lock Reclosable Fasteners", 3M, Industrial Business Industrial Adhesives and Tapes Division, St. Paul, MN 55144-1000, Aug. 2005, pp. 1-6.

* cited by examiner

*Primary Examiner* — Neil Abrams
*Assistant Examiner* — Phuong T Nguyen
(74) *Attorney, Agent, or Firm* — Howard IP Law Group, P.C.

(57) ABSTRACT

An article includes a plurality of stems projecting from a surface thereof. Each stem includes a hollow stalk projecting orthogonally from the surface and a hollow head defined on a distal end of the hollow stalk. The head includes a flange section extending from the distal end of the hollow stalk and having an outer diameter greater than an outer diameter of the hollow stalk at the distal end. A cap section extends from the flange section, defines a distal end of the stem and has a generally convex contour. The cap section has a first wall thickness at the distal end of the stem, a second wall thickness at a junction of the cap section and the flange section and a third wall thickness at a circumferential section intermediate the distal end and the flange section. The third wall thickness is less than the first and second wall thicknesses.

25 Claims, 11 Drawing Sheets

HOLLOW STEM DESIGN FOR HIGH DENSITY INTERCONNECTS

FIELD OF INVENTION

The present invention relates generally to interconnect systems, and more particularly, to high density electronic interconnect systems.

BACKGROUND

Fasteners, solders and adhesives have been used to attach components to primary hardware and structures. For example, integrated circuit (IC) chips are typically soldered to motherboards. However, solders are subject to problems such as cracking which may cause a circuit board to malfunction or to fail. Furthermore, solders conventionally include lead; which may be undesirable in some applications. Adhesives used to connect a component to a primary hardware often require a bong cure time. Further, adhesives often employ undesirable solvents for attachment. Moreover, once the component is attached to a structure using solder or adhesive, the component may not be repositioned without damaging the component and/or the structure.

Other options include coating the surface of mechanical interconnects with an electrically conductive material. Several of the known mechanical interconnect systems include hock and loop fasteners available under the trademark Velcro® from Velcro USA, Inc., Manchester, N.H. and reclosable fasteners available under the trademark 3M™ Dual Lok™ from 3M, St. Paul, Minneapolis. However, such mechanical fasteners suffer from disadvantages such as unpredictable contact area, which may prove detrimental to consistent high electrical conductivity, and insufficient locking strength. These fasteners are also subject to frictional locking which may deform the fastener upon multiple engagement/disengagement cycles. Such fasteners provide rather limited holding force that rapidly decreases with repeated cycles of engagement and disengagement. Alternatives are, therefore, desirable.

SUMMARY

According to an embodiment of the invention, an article of manufacture includes a plurality of stems projecting from a surface of the article for interconnecting with another body having a corresponding plurality of stems. Each one of the plurality of stems includes a hollow stalk projecting substantially orthogonally, at a proximal end thereof, from the surface and a hollow head defined on a distal end of the hollow stalk. The head is preferably dome shaped, and more preferably of a mushroom shape or a convex structure. The head includes a flange section extending from the distal end of the hollow stalk and having an outer diameter greater than an outer diameter of the hollow stalk at the distal end. The head further includes a cap section extending from the flange section and defining a distal end of the stem. The cap section has an outer surface that is of a generally convex contour and has a first wall thickness at the distal end of the stem, a second wall thickness at a junction of the cap section and the flange section and a third wall thickness at a circumferential section intermediate the distal end and the flange section. The third wall thickness is less than the first and second wall thicknesses.

According to an embodiment of the invention, the wall thickness of the cap section decreases continuously from the first wall thickness at the distal end of the stem to the third wall thickness at the circumferential section. The wall thickness of the cap section increases continuously from the third wall thickness at the circumferential section to the second wall thickness at the junction.

According to another embodiment of the invention, a system includes a first interconnecting article having a first plurality of stems extending from a first surface of the first article and a second interconnecting article configured for connecting with the first interconnecting article and having a second plurality of stems extending from a second surface of the second article. Each one of the first and second pluralities of stems includes a hollow stalk projecting substantially orthogonally, at a proximal end thereof, from one of the first and second surfaces and a hollow head defined on a distal end of the hollow stalk. The head includes a flange section extending from the distal end of the hollow stalk and having an outer diameter greater than an outer diameter of the hollow stalk at the distal end. The head further includes a cap section extending from the flange section and defining a distal end of the stem. The cap section has a generally convex contour and has a first wall thickness at the distal end of the stem, a second wall thickness at a junction of the cap section and the flange section and a third wall thickness at a circumferential section intermediate the distal end and the flange section. The third wall thickness is less than the first and second thicknesses.

When the second surface is superposed on the first surface such that the heads of second plurality of stems are in general contact engagement with, but laterally offset from, the heads of the first plurality of stems, a sub-set of stems of the first plurality of stems defines a gap and accommodates a head and a stem of the second plurality of stems therein, upon an application of a first force in excess of a first predetermined threshold on at least one of the first and second articles urging the at least one of the first and second articles toward the other article.

Applying a second force in excess of a second predetermined threshold on at least one of the first and second articles in a direction opposite of the first force pulling the first and second articles away from each other causes the stem of the second plurality of stems to be released from the at least one sub-set of the stems of the first plurality of stems.

An electrical interconnect apparatus includes a substrate and a plurality of stems projecting from the substrate. Each of the plurality of stems includes a hollow stalk projecting generally orthogonally, at a proximal end thereof, from the substrate and a generally convex, hollow head defined on a distal end of the stalk. The hollow head includes a flange section extending from the distal end of the stalk and having an outer diameter greater than an outer diameter of the stalk at the distal end. The hollow head further includes a cap section have a generally convex contour extending from the flange section. A distal end of the cap section is configured to flex about a circumferential section of the cap section along a longitudinal axis of the stalk, responsive to a force acting thereon. The outer diameter of the cap section increases from the circumferential section toward the flange section, defining an engagement section. The plurality of stems is fabricated from at least an electrically conducive material.

According to an embodiment of the invention, the circumferential section has a wall thickness less than a wall thickness of the cap section at any other circumferential section. The cap section has a wall thickness at the distal end greater than the wall thickness of the circumferential section.

BRIEF DESCRIPTION OF THE DRAWINGS

Understanding of the present invention will be facilitated by' consideration of the following detailed description of the exemplary embodiments of the present invention taken in conjunction with the accompanying drawings, in which like numerals refer to like parts and in which.

DETAILED DESCRIPTION

It is to be understood that the figures and descriptions of the present invention have been simplified to illustrate elements that are relevant for a clear understanding of the present invention, while eliminating, for purposes of clarity, many other elements found in such interconnecting bodies and reclosable fasteners. However, because such elements are well known in the art, and because they do not facilitate a better understanding of the present invention, a discussion of such elements is not provided herein. The disclosure herein is directed to all such variations and modifications known to those skilled in the art.

Figure 1A:
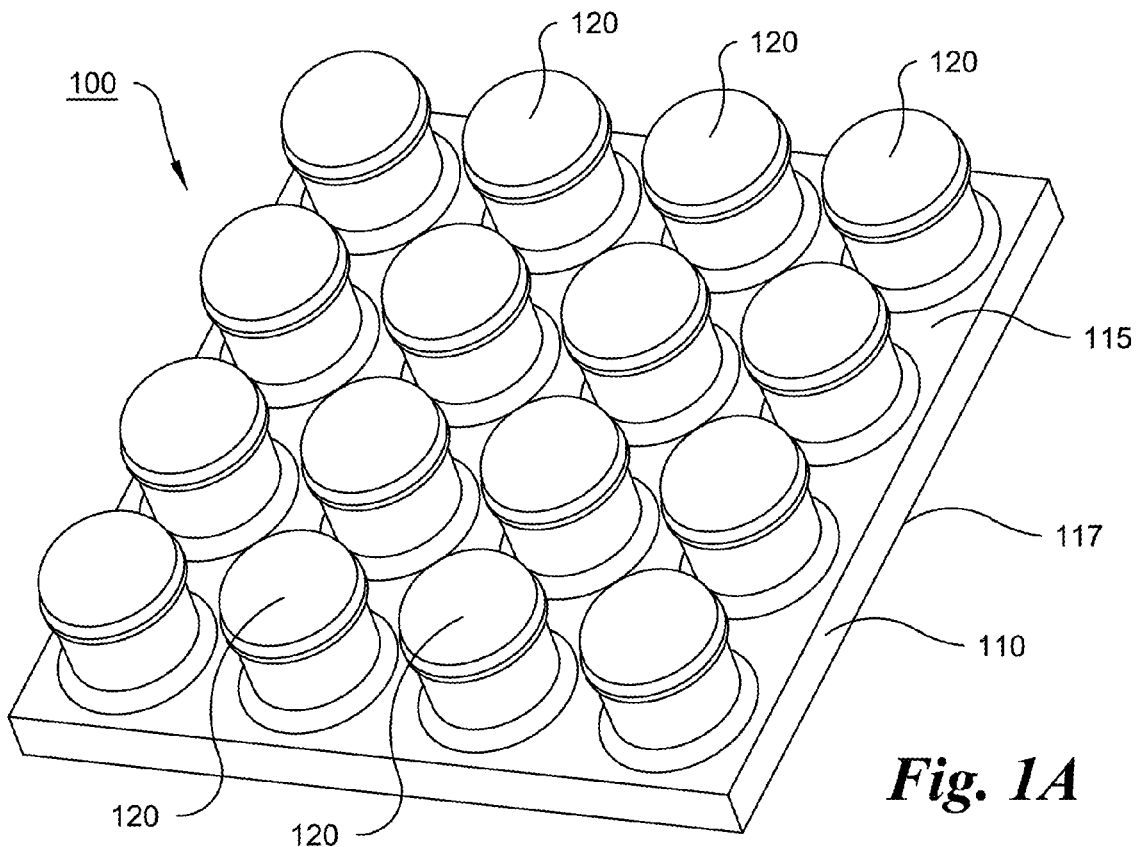
FIG. 1A is a perspective view of a body with a plurality of hollow stems projecting from a surface thereof, according to an embodiment of the invention.
Figure 1B:
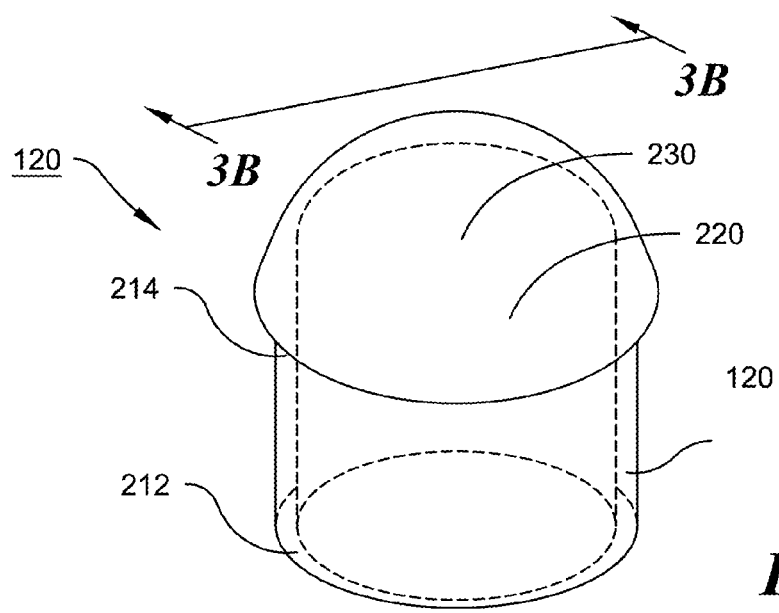
FIG. 1B illustrates a hollow stem of FIG. 1 with a hollow bulbous head, according to an embodiment of the invention.
Figure 2:
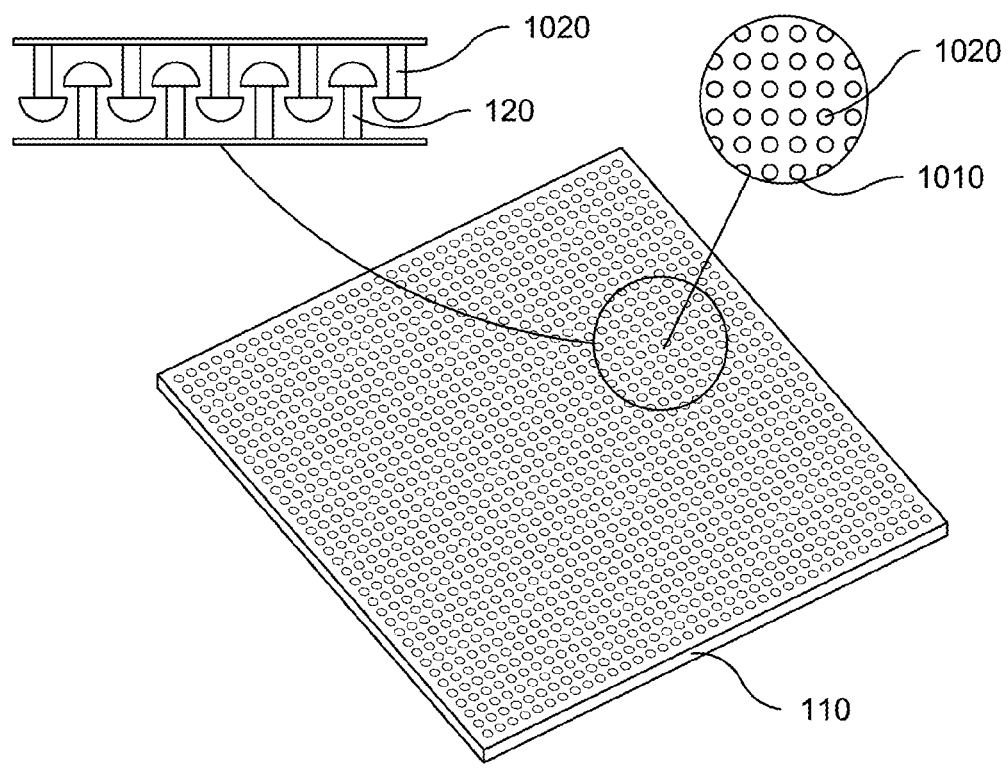
FIG. 2 illustrates a substrate with a first plurality of hollow stems projecting from a surface thereof and a ball grid array package with a second plurality of hollow stems projecting from a surface thereof, according to an embodiment of the invention.

Referring to the embodiment of FIG. 1, there is illustrated an interconnecting body 100. In the illustrated embodiment, body 100 includes a substrate or base 110 and a plurality of hollow stems 120. Each one of the plurality of hollow stems 120 projects generally orthogonally from a first surface 115 of base 110. A second surface 117 of base 110 may be adapted to be affixed or otherwise fastened to a component or a structure (not shown). In the illustrated embodiment, base 110 is a generally flat, planar substrate. In other embodiments, base 110 may take the form of a substrate having a curved profile. In yet other configurations, base 110 may take the form of an outer skin of a mechanical structure or an electrical component such as a circuit board or an electrical component. For example, the solder balls in a ball grid array (BGA) package 1010 (known in the art) may be replaced by hollow stems 1020, as illustrated in FIG. 2, to engage hollow stems 120 of substrate 110.

In an exemplary embodiment, body 100 may be fabricated from engineering plastics using, for example, high tolerance injection molding processes, such as those currently in use for compact disc (CD) and Digital Video Disc (DVD) manufacture. Non-limiting examples of engineering plastics suitable for fabrication of surface 100 include polycarbonates (PC), acrylonitrile butadiene styrene (ABS), polyamides (PA), polybutylene terephthalate (PBT), polyethylene terephthalate (PET), polyphenylene oxide (PPO), polysulpone (PSU), polyetherketone (PEK), polyetheretherketone (PEEK), polyimides and polyphenylene sulphide (PPS). Other suitable materials include materials having high heat resistance, mechanical strength, rigidity, chemical stability and flame retardance. In an exemplary embodiment, body 100 including hollow stems 120 may be fabricated from an electrically conductive material. In an exemplary embodiment, a non-conductive plastic may be surface coated with a nano-composite material such as carbon nanotubes composite or with metallic nano-spheres for imparting and electrical conductivity to the embodiment. Since such coatings are known in the art, they are not described in detail for sake of brevity after the fabrication of hollow stems 120. In another embodiment, hollow stems may be fabricated from an electrically conductive composite. Examples of electrically conductive composite include, but are not limited to, plastics that contain additives that impart such conductivity via inclusion of metallic powders, carbon black, carbon fibers, mats, and metalized glass fibers and spheres.

In another configuration, body 100 including hollow stems 120 may be fabricated from a thermally conductive material, for example, from carbon nanotube based composites. In another embodiment, the surface of body 100 or at least stem elements 120 may be coated with a thermally conductive material such as a carbon nanotube composite or with metallic spheres.

Referring now to FIG. 1A, hollow stem 120 includes a hollow stalk 210 and a hollow bulbous head 230 defining inner space 220. A proximal end 212 of stalk 210 is coalesced to and extends from surface 115 (of FIG. 1) of base 110 (of FIG. 1). Head 230 is coalesced to and extends from an end 214 of stalk 210. In the illustrated embodiment, hollow stem 120 is a unitary, monolithic structure coalesced to and extending from base 110 (of FIG. 1). The height of stalk 210 is the distance between ends 212 and 214.

Figure 3A:
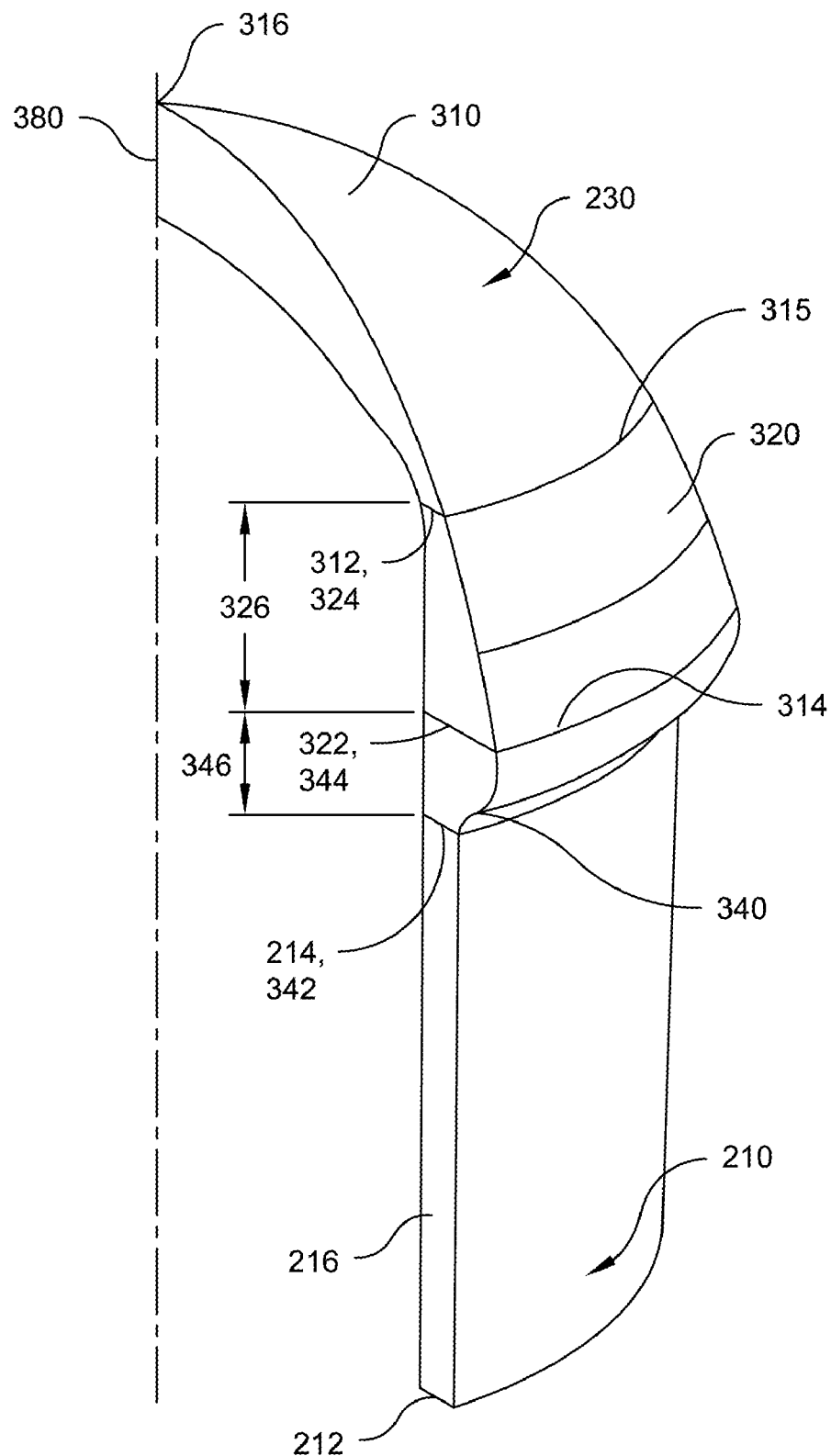
FIG. 3A is a partial perspective cross-sectional view of the hollow stem of FIG. 1, according to an embodiment of the invention.
Figure 3B:
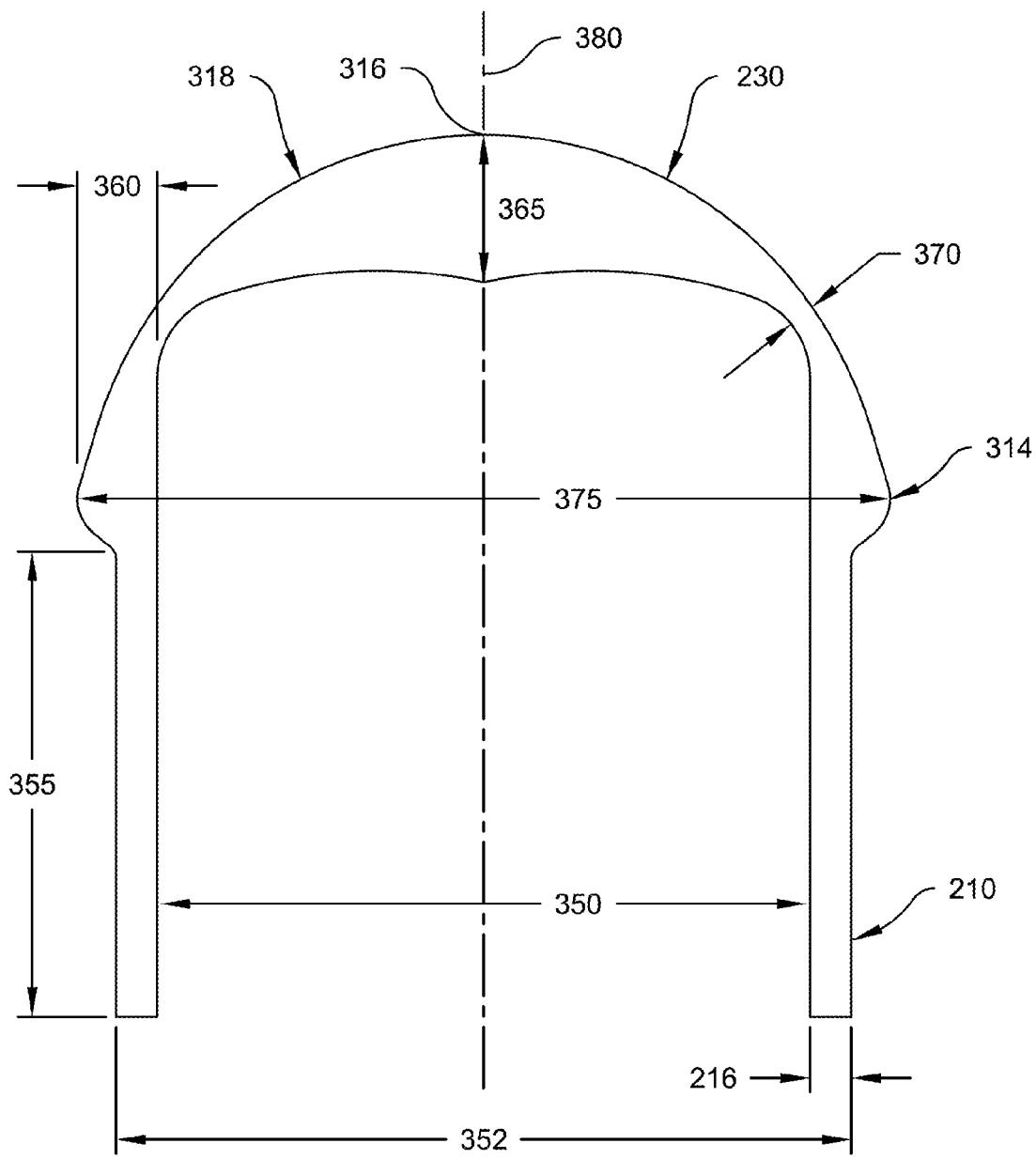
FIG. 3B is a cross-sectional view of the hollow stem of FIG. 1, according to an embodiment of the invention.

FIG. 3A shows a partial perspective cross-sectional view of a hollow stem 120. FIG. 3B shows a cross-sectional view of hollow stem 120 along lines 3B-3B, according to an embodiment of the invention. With reference to FIGS. 3A and 3B, stalk 210 has a generally uniform wall thickness 216, a generally uniform inner diameter 350, and a generally uniform outer diameter 352 between ends 212, 214. In other embodiments, stalk 210 may have a non-uniform wall thickness 216 and/or a non-uniform inner diameter 350 and/or a non-uniform outer diameter 352, depending on the requirements of a given application. In one configuration, head 230 includes a flange section 314 and a cap section 310. Flange section 314 has an outer diameter 375 greater than an outer diameter 352 at distal end 214 of hollow stalk 210. In an exemplary configuration, the outer surface of cap section 310 has a generally convex contour 318. Cap section 310 has a circumferential section 315 intermediate of flange section 314 and a distal end or apex 316. Distal end 316 defines a distal end of stem 120. An engagement section 320 is defined on cap section 310 between intermediate circumferential section 315 and flange section 314. A disengagement section or locking section 340 is defined between flange section 314 and distal end 214 of stalk 210. Engagement section 320 has a first end 322 and a second end 324. Engagement section 320 extends between cap section 310, at second end 324, and disengagement section 340, at first end 322. Disengagement section has a first end 342 and a second end 344. Disengagement section 340, in turn, extends between engagement section 320, at second end 344, and stalk 210, at first 342.

Cap section 310 acts as an alignment mechanism for guiding a counterpart bulbous head (not shown) of a hollow stem (not shown) projecting from a second corresponding interconnecting body (not shown) of like dimensions and superposed on body 100 toward a gap (not shown) defined by adjacent hollow stems 120. Cap section 310 may also provide structural rigidity to hollow stem 120. Engagement section 320 has a generally increasing outer diameter from circumferential section 315 to flange, section 314. Engagement section 320 is configured to engage a corresponding engagement section (not shown) of a hollow stem (not shown) projecting from the second body superposed on body 100 and, responsive to the engagement therebetween, provides a bending force to stalk 210 in a radial direction. Engagement section 320, thus, serves to bend stalk 210 in a radial direction, to facilitate the entry of a bulbous head (not shown) into a gap (not shown) defined by adjacent hollow stems 120 by widening the gap (not shown). Engagement section 320, by providing the bending forces, also reduces the kinematic friction between the engaging hollow stems. Disengagement section 340 has a generally decreasing outer diameter from flange section 314 to distal end 214 of hollow stalk 210. Disengagement section or locking section 340 serves to engage a corresponding disengagement section 340 of a hollow stem (not shown) extending from the second body superposed on body 100 and provide a holding force resisting the movement of the bulbous head (not shown) of a hollow stem of a second interconnecting body out of the gap defined by adjacent hollow stems 120, when the interconnecting bodies are subject to a force pulling them away from each other.

Cap section 310 is coalesced to and extends from a second end 324 of engagement section 320 to apex 316. It will be understood that apex 316 may have a convex contour or may be flat relative to cap section 310. Cap section 310 has a tapered cross-section with a maximum first thickness 365 about apex 316 and a second minimum thickness 370 about intermediate circumferential section 315. Second thickness 370 of cap section 310 is thinner than first thickness 365 of cap section 310 as well as a first thickness 360 of engagement section 320 or flange section 314. Such a configuration enables circumferential section 315 to function as a hinge.

For instance, upon application of a force on hollow head 230 toward stalk 210 in the form of a corresponding hollow bulbous head (not shown) of a hollow stem (not shown) projecting from the superposed second body (not shown), cap section 310 may reversibly bend or flex about circumferential section 315 relative to engagement section 320 and move along central or longitudinal axis 380 of stalk 210.

Still referring to FIGS. 3A and 3B, at a second end 324, engagement section 320 is coalesced to and extends from intermediate circumferential section 315 of cap section 310 and, at first end 322, coalesces into second end 344 of disengagement section 340. Engagement section 320 has an inclined outer surface for engaging a corresponding engagement section (not shown) of a hollow stem (not shown) projecting from the second body (not shown) superposed on body 100 (of FIG. 1). Engagement section 320 has a tapered cross-section having a first maximum thickness 360 at first end 322 and a second minimum thickness 370 at second end 324. The thickness of engagement section 320, thus, varies in a non-linear, continuously increasing fashion from second thickness 370 at circumferential section 315 to first thickness 360 at flange section 314. Thus, engagement section 320 has a first gradient defined from second end 324 to first end 322. The first gradient of engagement section 320 may be derived as the difference, between an outer diameter of circumferential section 315 and outer diameter 375 of flange section 314, divided by a height 326 of engagement section 320.

At a second end 344, disengagement section 340 is coalesced to and extends from first end 322 of engagement section 320 and, at a first end 342, coalesces into end 214 of stalk 210. Disengagement section 340 has an inclined outer surface for engaging a corresponding disengagement section (not shown) of a bulbous head (not shown) of a hollow stem (not shown) projecting from the second body (not shown) superposed on body 100 (of FIG. 1), when the bulbous head (not shown) is lodged in the gap (not shown) defined by adjacent hollow stems 120. Disengagement section 340 has a tapered cross-section having a first maximum thickness 360 at second end 344 and a second minimum thickness 216 at first end 342. The thickness of disengagement section 340, thus, varies in a non-linear, continuously decreasing fashion from first thickness 360 to second thickness 216 at first end 342. Thus, disengagement section 340 has a second gradient defined from first end 342 to second end 344. In an exemplary embodiment, the second gradient of disengagement section 340 is greater than the first gradient of engagement section 320. The second gradient of disengagement section 340 may be derived as the difference, between outer diameter 375 of flange section 314 and outer diameter 352 of stalk 210 at distal end 214, divided by a height 346 of disengagement section 340.

In one configuration, flange section 314 may have a ring-like bulging profile. Flange section 314 has thickness 360 which is greater than minimum thickness 370 of engagement section as well as minimum thickness 216 of disengagement section. Flange section 314 serves to limit the local deformation of head 230 when engagement section 320 engages a corresponding engagement section (not shown) of a bulbous head (not shown) of a hollow stem (not shown) projecting from the second body (not shown) superposed on body 100 (of FIG. 1) as well as when disengagement section 340 engages a corresponding disengagement section (not shown) and a force is pulling the second body away from body 100 (of FIG. 1).

In an exemplary embodiment, hollow head 230 may have diameter 375 of about 490 microns (μm) and stalk 210 may have height 355 of about 260 μm, wall thickness 216 of about 25 µm, and inner diameter 350 of about 400 µm, by way of non-limiting examples only. In one configuration, stalk 210 may have a ratio of height 355 to wall thickness 216 of about 10 and may range from about 7 to 13. Cap section 310 may have first thickness 365 of about 60 µm and second thickness 370 of about 16 µm. In an exemplary configuration, the ratio of first thickness 365 to second thickness 370 may range from about 3 to 5. In one configuration, engagement section 320 may have second thickness 370 of about 16 µm, first thickness 360 of about 45 µm and a height 326 of about 80 µm. Disengagement section may have first thickness 216 of about 25 µm, maximum thickness 360 of about 45 µm and a height 346 of about 40 µm in an exemplary embodiment.

In an exemplary embodiment, engagement section 320 may have a first gradient of about 0.15 and disengagement section 340 may have a second gradient of about 0.8. In one configuration, the ratio of second gradient of disengagement section 340 to first gradient of engagement section 320 may range between about 4 to 6. It will be understood that different dimensions and ratios may be selected for hollow stem 120, including hollow stalk 210 and hollow head 230, depending on the requirements of a given application. One skilled in the art will further appreciate that the given dimensions may be scaled down to nanometer levels by a factor of about 1000 as well as scaled up to millimeter levels by a factor of about 1000.

Figure 4:
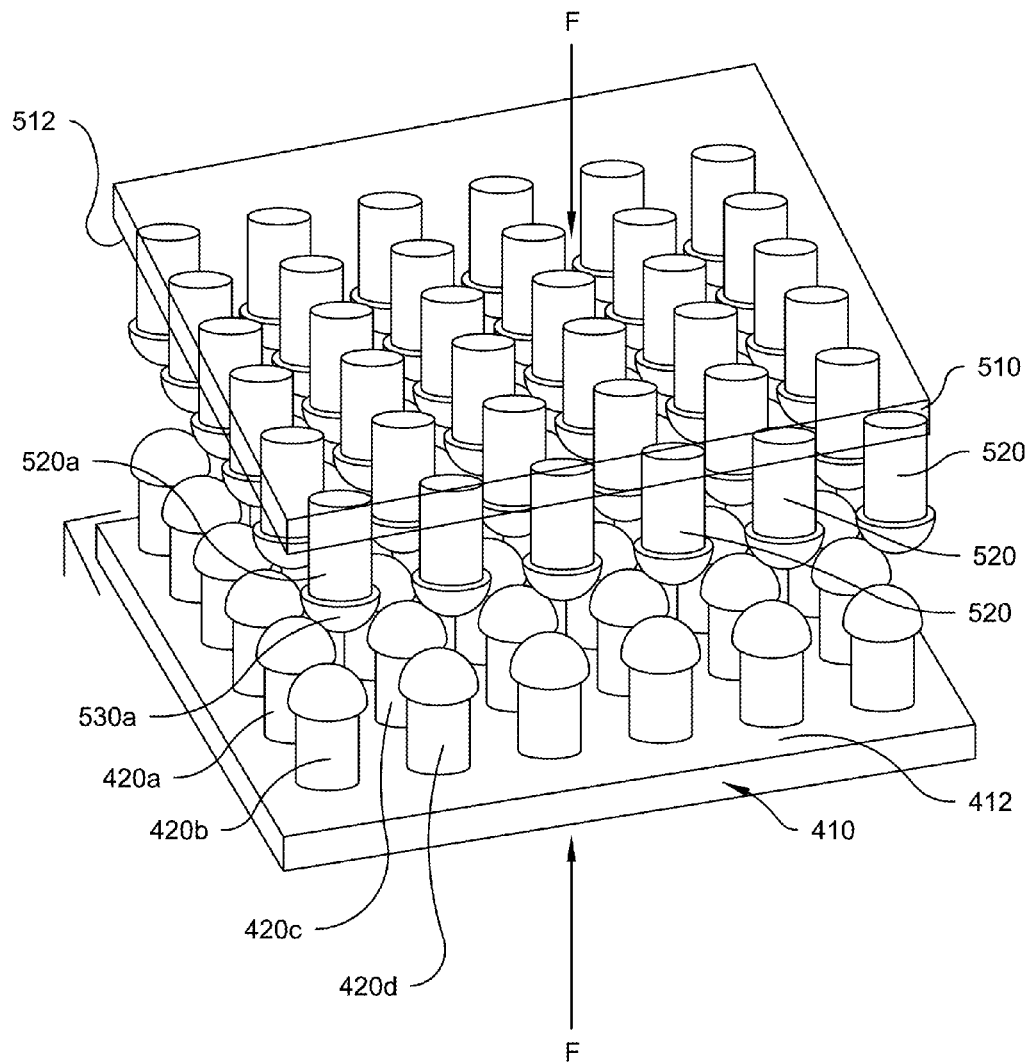
FIG. 4 is a perspective view of a first body with a first plurality of hollow stems projecting from a surface thereof engaging a second body with a second plurality of hollow stems projecting from a surface thereof, according to an embodiment of the invention.
Figure 5A:
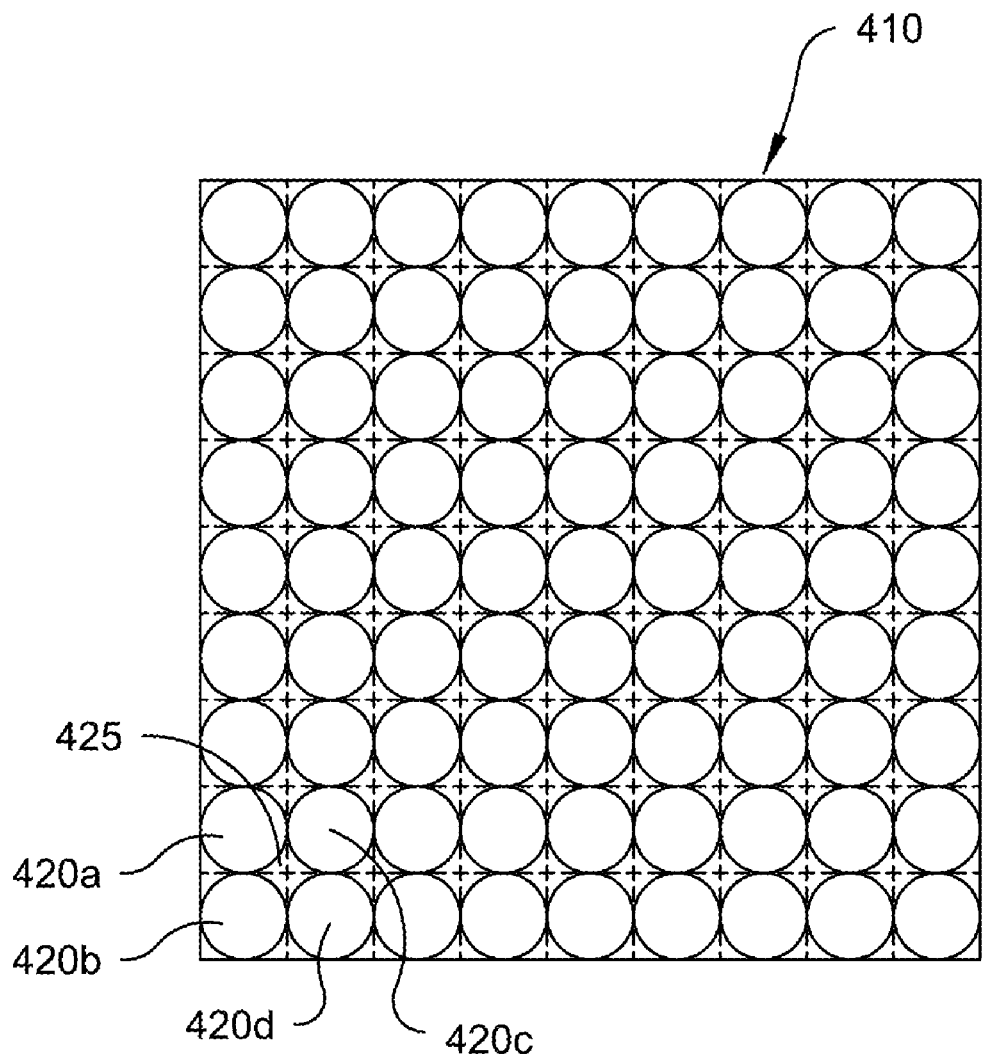
FIG. 5A is a schematic plan view of a body with a plurality of hollow stems projecting from a surface thereof and arranged in a square pattern, according to an embodiment of the invention.
Figure 5B:
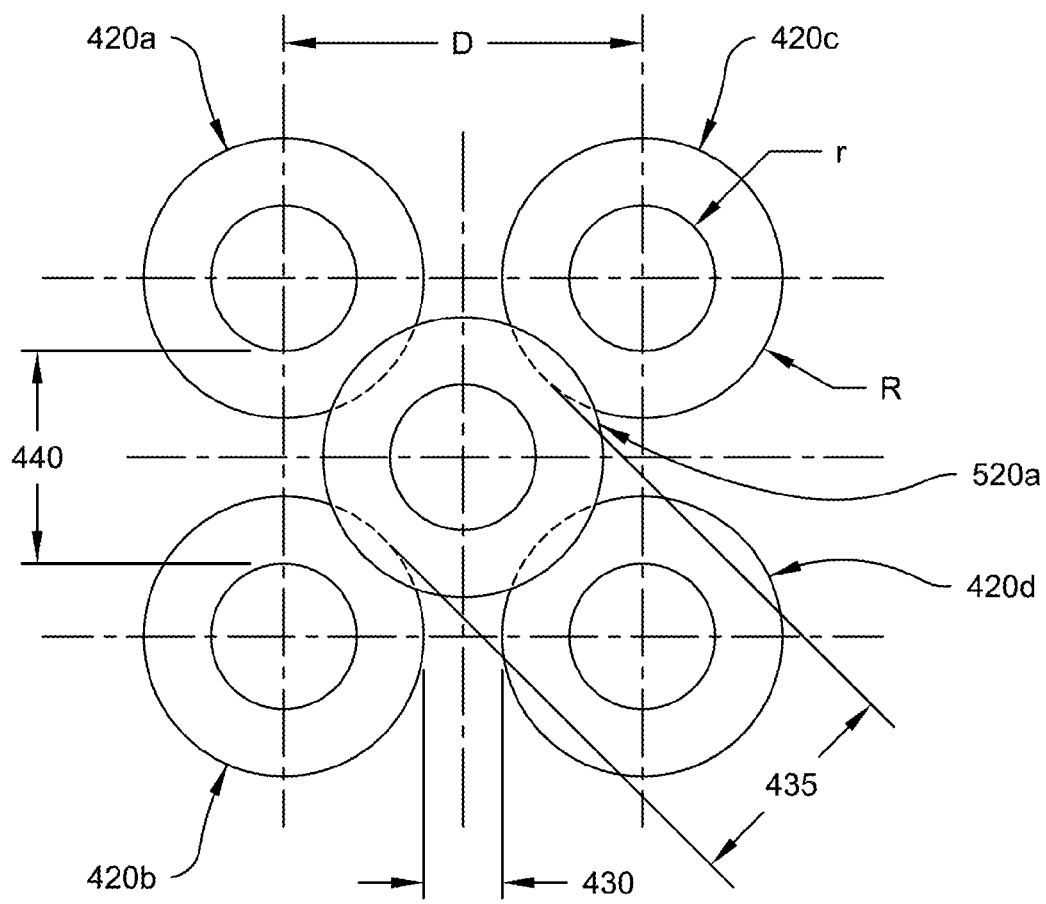
FIG. 5B is a schematic plan view of a sub-set of the plurality of hollow stems projecting from a surface of the first body of FIG. 5A receiving a hollow stem projecting from a surface of a second body, according to an embodiment of the invention.

Referring now to FIGS. 4, 5A and 5B, first and second interconnecting bodies 410, 510 are illustrated, according to an embodiment of the invention. Each of first and second interconnecting bodies 410, 510 has a corresponding first and second pluralities of hollow stems 420, 520, of like dimensions, projecting generally orthogonally from a first surface 412 and a second surface 512 respectively and facing each other. Second interconnecting body 510 is superposed on first interconnecting body 410 such that heads 230 of first and second pluralities of stems 420, 430 are in general contact engagement with each other. In an exemplary configuration, heads 230 of first and second pluralities of stems 420, 430 may be laterally offset from one another. Stalk 210 (of FIG. 2) of hollow stem 420 has a radius r and bulbous head 230 (of FIG. 2) of hollow stem 420 has a radius R. Each of the first and second pluralities of hollow stems 420, 520 is spaced apart from one another by a predetermined distance D. The adjacent bulbous heads of respective adjacent stems $420_a$, $420_b$ are separated by a distance 430 whereas the adjacent stalks of respective adjacent stems $420_a$, $420_b$ are separated by a distance 440. Distance 430 between two adjacent bulbous heads of respective adjacent stems $420_a$, $420_b$ is smaller than diameter 375 (of FIG. 3B) of head 230, whereas distance 440 between two adjacent stalks of respective adjacent stems $420_a$, $420_b$ is greater than diameter 375 (of FIG. 3B). Likewise, a distance 435 between two diagonal stems $420_b$, $420_c$ has a value less than diameter 375 of head 230 and more than an outer diameter of stem 210, i.e., inner diameter 350 plus two times wall thickness 216 of stem 210.

In the illustrated embodiment, a sub-set $420_a$, $420_b$, $420_c$, $420_d$ of plurality of hollow stems 420 of body 410 define a central gap 425 therebetween to receive and accommodate one hollow stem 520a of surface 510. Likewise, a sub-set (not shown) of plurality of hollow stems 520 of body 510 define a central gap (not shown) therebetween to receive and accommodate at least one hollow stem 420a of body 410. First and second bodies 410, 510 are positioned so that heads 430 of first plurality of stems 420 are in general contact engagement with heads 530 of second plurality of stems 520. Upon application of an engagement force F on at least one of first and second bodies 410, 510, pushing first and second bodies 410, 510 toward each other, at least one of second plurality of hollow stems 520a is received and accommodated by central gap 425 defined by a sub-set $420_a$, $420_b$, $420_c$, $420_d$ of first plurality of hollow stems 420 and at least one of first plurality of hollow stems 420 is received and accommodated by the central gap (not shown) defined by a sub-set (not shown) of second plurality of hollow stems 520. Thus, bodies 410, 510 are interconnected with each other via first and second pluralities of hollow stems 420, 520.

The application of engagement force F on at least one of surfaces 410, 510 causes a bulbous head $530_a$ of hollow stem $520_a$ to splay each of hollow stems $420_a$, $420_b$, $420_c$, $420_d$ away from their respective central axes 380 (of FIG. 3B). Bulbous head $530_a$ is then lodged in central gap 425 defined by the sub-set of hollow stems $420_a$, $420_b$, $420_c$, $420_d$. Once bulbous head $530_a$ is accommodated in central gap 425, hollow stems $420_a$, $420_b$, $420_c$, $420_d$ revert to their respective initial positions, thereby locking bulbous $530_a$ in central gap 425. It is understood that because of the hollow nature of stem 420, stem 420 is relatively stiffer in an axial direction along stem 420 as compared to the stiffness in a radial direction. Thus, engagement force F on surfaces 410, 510 transmitted via hollow stem $520_a$ causes hollow stems $420_a$, $420_b$, $420_c$, $420_d$ to bend away from their respective central axes 380 (of FIG. 3B) rather than buckling inward along central axes 380 or providing resistance to bulbous head 530a. As will be described later, solid stems may be subject to friction locking, thereby preventing effective engagement between two interconnecting bodies under certain circumstances. Furthermore, first thickness 365 (of FIG. 3B) of head 230 resists inward buckling of head 230 as well as of stalk 210 of hollow stem 420, when bodies 410, 510 are subjected to engagement force F.

Figure 6:
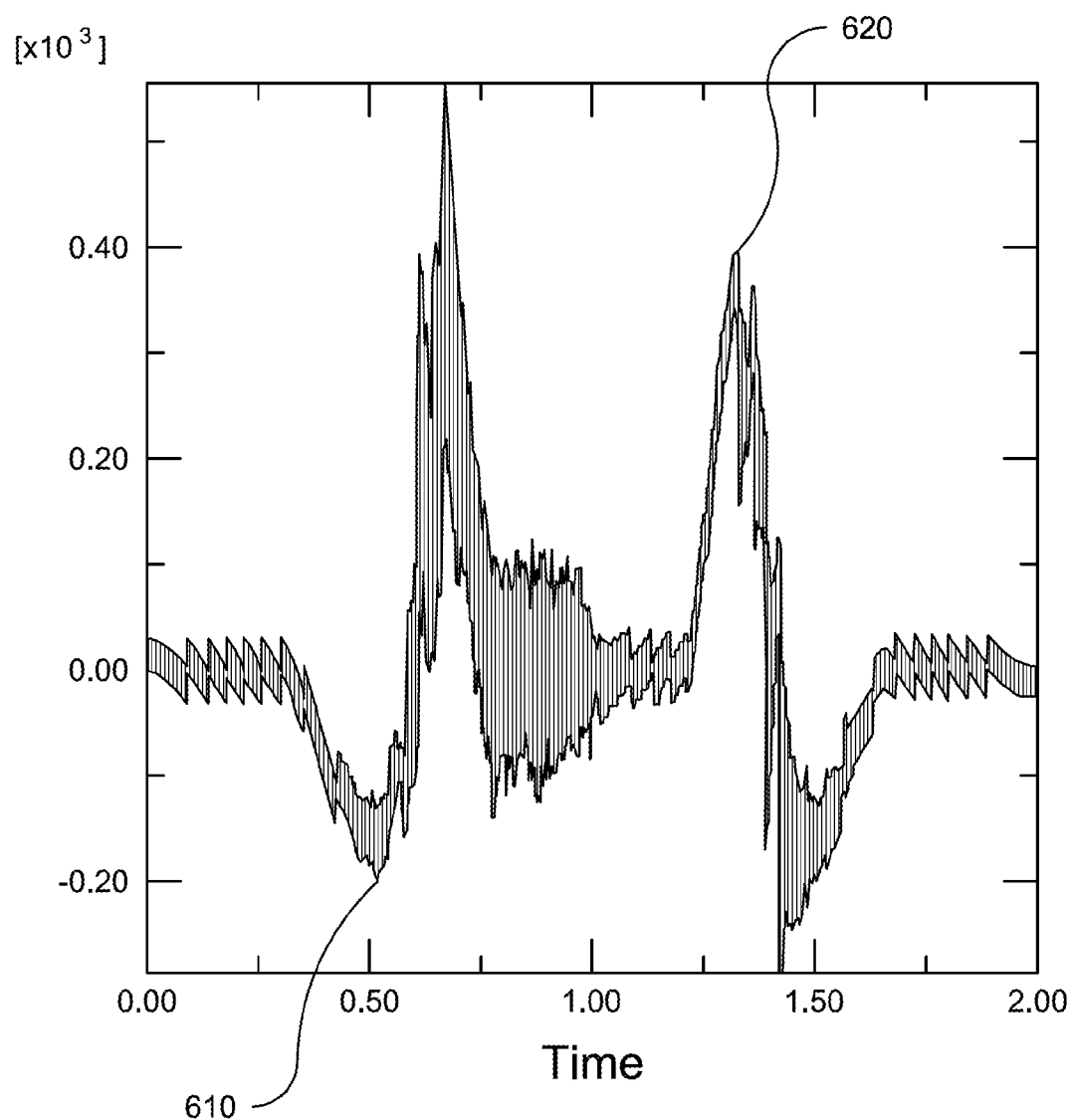
FIG. 6 illustrates simulated engagement and disengagement forces for the interconnecting bodies of FIG. 5A, according to an embodiment of the invention.

Tapered engagement sections 320 (of FIG. 3A) of bulbous heads 230 of hollow stems $420_a$, $420_b$, $420_c$, $420_d$ and $520_a$ facilitate the entry of head 230 of hollow stem $520_a$ into gap 425 by providing bending forces on hollow stems $420_a$, $420_b$, $420_c$, $420_d$. Tapered disengagements sections 340 (of FIG. 3A) and flange sections 314 of heads 230 of hollow stems $420_a$, $420_b$, $420_c$, $420_d$ and $520_a$ provide resistance to the movement of bulbous head 230 of hollow stem $520_a$ out of central gap 425. Because the gradient of disengagement section 340 is relatively greater than the gradient of engagement section 320, a disengagement force required to pull bulbous head 230 of hollow stem $520_a$ out of central gap 425 is greater than the engagement force required to insert bulbous head 230 of hollow stem $520_a$ into central gap 425. Referring to FIG. 6, simulation results for an exemplary embodiment indicate that the required disengagement force, illustrated as peak 620, in a direction opposite of the engagement force is almost double the engagement force, illustrated as trough 610.

Still referring to FIGS. 5A-5B, hollow stems 420 are arranged in a square pattern as described below, in an embodiment of the invention. Any four adjacent stems of the plurality of stems 420, for instance, stems $420_a$, $420_b$, $420_c$, $420_d$ which define a central gap 425 for receiving and accommodating bulbous head 230 of hollow stem $530_a$, define the four vertices of a square. A first distance D between stems $420_a$ and $420_c$ is equal to a second distance D between stems $420_c$ and $420_d$, to a third distance D between stems $420_a$ and $420_b$ and to a fourth distance D between stems $420_b$ and $420_d$. In an exemplary embodiment, distance D may have a value lying between about one time diameter 375 of bulbous head 230 and about two times diameter 375 of bulbous head 230.

Figure 7A:
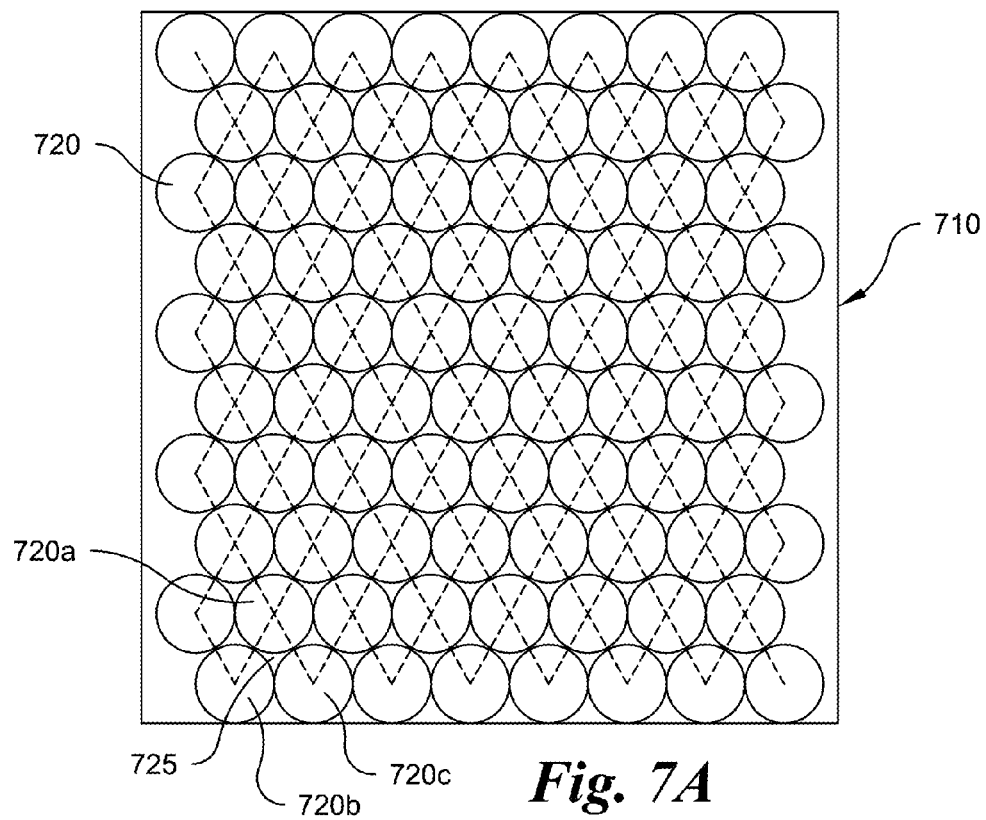
FIG. 7A is a schematic plan view of a body with a plurality of hollow stems projecting from a surface thereof and arranged in a triangle pattern, according to an embodiment of the invention.
Figure 7B:
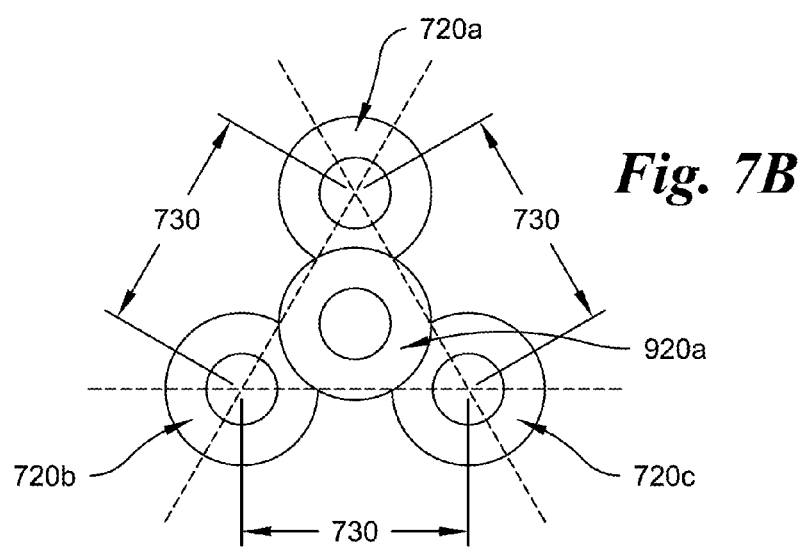
FIG. 7B is a schematic plan view of a sub-set of the plurality of hollow stems projecting from a surface of the first body of FIG. 7A receiving a hollow stem projecting from a surface of a second body superposed on the first body, according to an embodiment of the invention.

Now referring to FIGS. 7A-7B, hollow stems $720_a$, $720_b$, $720_c$, of interconnecting body 710 are arranged in a triangle pattern as described below, according to another embodiment of the invention. Any three adjacent stems of the plurality of stems 720, for instance, stems 720$_a$, 720$_b$, 720$_c$, which define a central gap 725 for receiving and accommodating a head 230 of a hollow stem 720$_a$, define the three vertices of an equilateral triangle. Gap 625 receives and accommodates a hollow stem 920$_a$ of a superposed interconnecting body (not shown). A first distance 720 between stems 720$_a$ and 720$_b$ is equal to a second distance 720 between stems 720$_b$ and 720$_c$ and to a third distance 720 between stems 720$_c$ and 720$_a$. In other embodiments, hollow stems 720 may be arranged in different patterns, such as pentagon, hexagon and other geometrical patterns, depending on the requirements of a given application. It will be appreciated that square and triangle patterns of hollow stems result in tighter patterns as compared to those resulting in other polygonal patterns.

Figure 8:
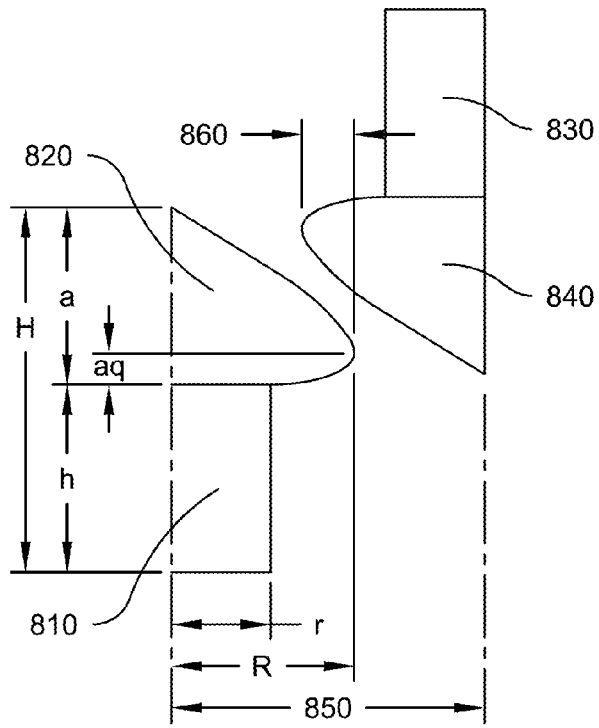
FIG. 8 is a schematic cross-sectional view of two conventional solid stems interacting with one another.

Referring now to FIG. 8, two conventional solid stems 810, 830 in prior art reclosable fastener surfaces are schematically illustrated. Stem 810 has a mushroom head 820 and stem 830 has a mushroom head 840. For a given radius R of mushroom heads 820, 840 and a given distance 850 between stems 810, 830, an overlap 860 is given by:

Overlap=2R–Distance between two stems.

Figure 9A:
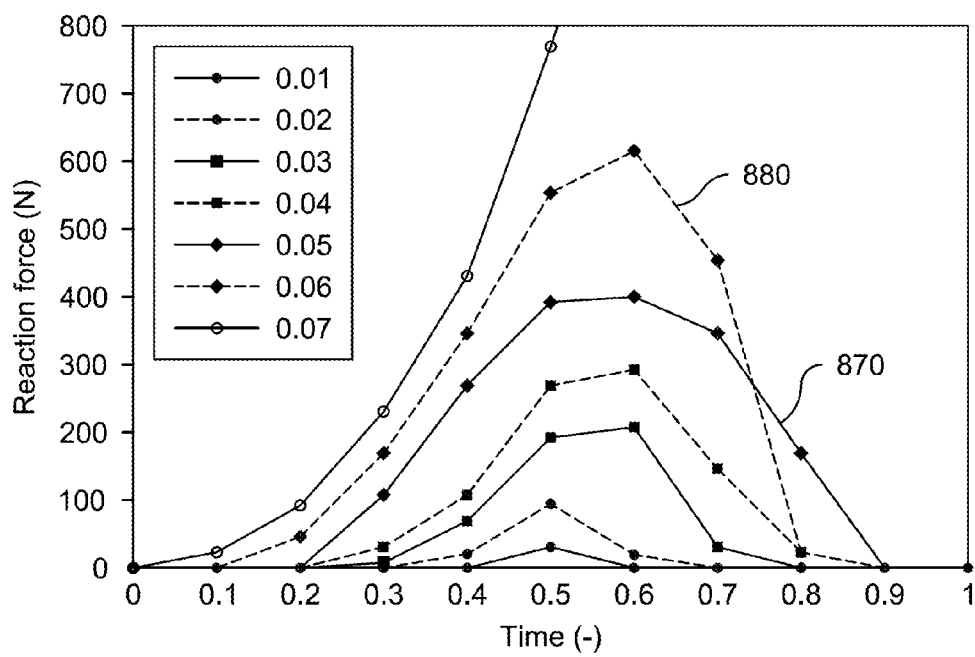
FIG. 9A is a chart illustrating the correlation of the engagement force and different values of overlap between the two solid stems of FIG. 8 for a constant value of the coefficient of friction.
Figure 9B:
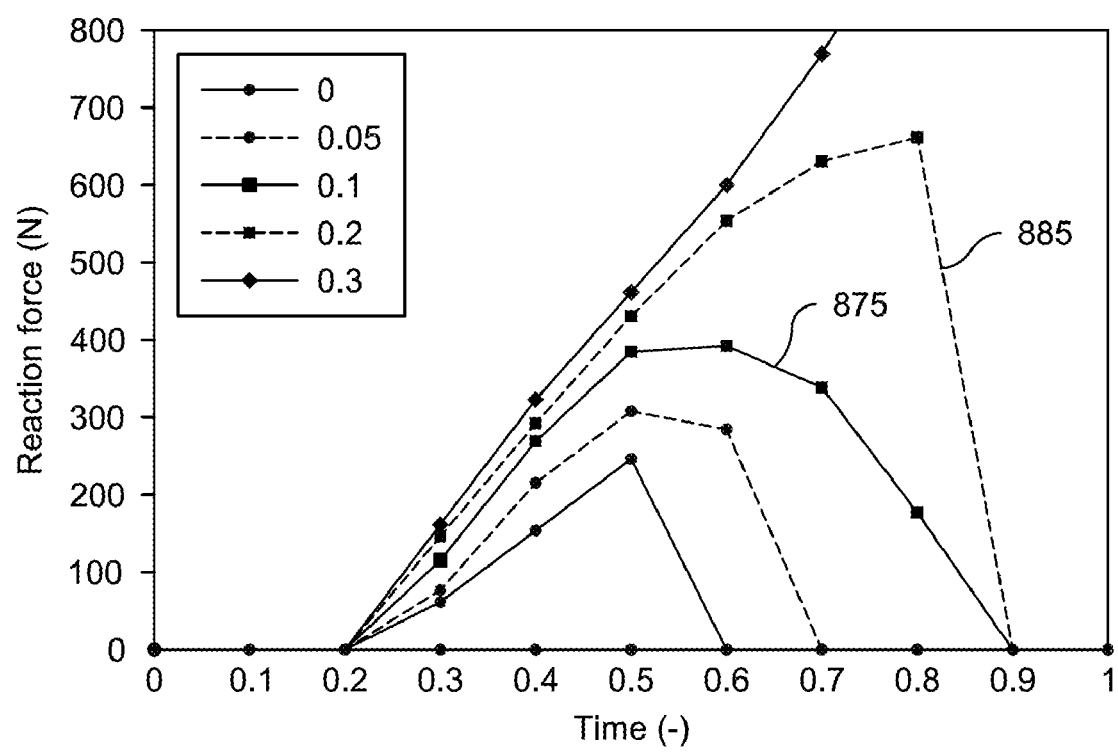
FIG. 9B is another chart illustrating the correlation of the engagement force and different values of coefficient of friction between the two solid stems of FIG. 8 for a constant value of the extent of the overlap between the two solid stems of FIG. 8.

FIGS. 9A, 9B illustrate the correlation between the engagement force, the extent of overlap of two mushroom heads and the coefficient of friction between the two mushroom heads. FIG. 9A illustrates the increase in engagement forces as the extent of overlap increases for a constant coefficient of friction 0.1. FIG. 9A further illustrates that for a coefficient of frication of 0.1, engagement is not possible when overlap is 0.06 times radius R of mushroom head 820, 840 due to friction locking between mushroom heads 820, 840. For instance, curve 870 illustrates the engagement force for an overlap of 0.05 times radius R and curve 880 illustrates the engagement force for an overlap of 0.06 times radius R.

Likewise, FIG. 9B illustrates the increase in the engagement forces as the coefficient of friction increases for a constant overlap of 0.05 times radius R of mushroom heads 820, 840. FIG. 9B further illustrates that for a constant overlap of 0.05 times radius R, engagement is not possible when coefficient of friction exceeds 0.2 due to frictional locking between mushroom heads 820, 840. For example, curve 875 represents the engagement force for coefficient of friction of 0.1 whereas curve 885 represents the engagement force for coefficient of friction of 0.2. Thus, for conventional solid stems, friction locking may occur any of the extent of overlap and the coefficient of friction of the stem material increases beyond a threshold.

An advantage of hollow stems is that the engagement and disengagement forces are independent of surface coefficient of friction between the bulbous heads. Therefore, interconnecting bodies with hollow stems are not subject to friction locking encountered in the known prior art interconnecting systems with solid stems under certain circumstances. Another advantage of the hollow stems is that during engagement, entire stem including the stalk and the bulbous head is subjected to deformation. Such deformation of the entire hollow stem keeps maximum strains in the stem within the material elastic limits. Yet another advantage of the hollow stems is that the engagement and disengagement forces may be controlled by changing the tapers of the engagement and disengagement sections of the bulbous head. As is known in the art, BGA technique requires heating of the BGA assembly to solder a BGA package to the circuit board having complementary copper pads. An advantage of the interconnecting hollow stems is that the heating step is eliminated, making the assembly step simpler and cheaper.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A connector for electrically or thermally interconnecting with a second connector, comprising:
   a plurality of flexible stems projecting from a surface of the connector, said plurality of flexible stems configured to interconnect with a corresponding plurality of flexible stems projecting from the second connector,
   wherein each one of said plurality of flexible stems comprises:
      a hollow stalk projecting substantially orthogonally, at a proximal end thereof, from said surface; and
      a hollow head defined on a distal end of said hollow stalk, wherein said head comprises:
         a flange section extending from said distal end of said hollow stalk and having an outer diameter greater than an outer diameter of said hollow stalk at said distal end; and
         a cap section extending from said flange section and defining a distal end of the stem, said cap section having a generally convex contour and having:
            a first wall thickness at the distal end of said stem;
            a second wall thickness at a junction of said cap section and said flange section; and
            a third wall thickness at a circumferential section intermediate said distal end and said flange section, said third wall thickness being less than said first and second wall thicknesses.

2. The connector according to claim 1, wherein the wall thickness of said cap section decreases continuously from said first wall thickness at said distal end of said stem to said third wall thickness at said circumferential section.

3. The connector according to claim 1, wherein the wall thickness of said cap section increases continuously from said third wall thickness at said circumferential section to said second wall thickness at said junction.

4. The connector according to claim 1, wherein a distance between a first and a second junction of a first and a second stem, respectively, of said plurality of flexible stems is less than the outer diameter of said flange section.

5. The connector according to claim 1, wherein a distance between a first and a second stalk of a first and a second stem, respectively, of said plurality of flexible stems is greater than the diameter of said flange section.

6. The connector according to claim 1, wherein said plurality of flexible stems comprises at least one of an electrically conductive material and a thermally conductive material.

7. The connector according to claim 1, wherein said first wall thickness of said cap section is greater than a wall thickness of said stalk.

8. The connector according to claim 1, wherein said third wall thickness of said cap section is less than a wall thickness of said stalk.

9. The connector according to claim 1, wherein said plurality of flexible stems is arranged in a square pattern, such that any four stems of said plurality of flexible stems define the vertices of a square, such that a central gap is defined therebetween, said central gap being adapted to receive a stem projecting from a second article therein.

10. The connector according to claim 1, wherein said plurality of flexible stems is arranged in a triangle pattern, such that any three stems of said plurality of flexible stems define the vertices of a triangle, such that a central gap is defined therebetween, said central gap adapted to receive a stem projecting from a second article therein.

11. The connector according to claim 1, wherein an outer surface of said cap section has a first gradient defined between said circumferential section and said flange section, and an outer surface of said flange section has a second gradient defined towards said distal end of stalk.

12. The connector according to claim 11, wherein said second gradient is greater than said first gradient.

13. A system for electrically or thermally engaging first and second connectors:
   wherein said first connector comprises a first plurality of flexible stems projecting from a first surface thereof;
   wherein said second connector comprises a second plurality of flexible stems projecting from a second surface thereof and configured for interconnecting with said first plurality of flexible stems,
   wherein each one of said first and second pluralities of flexible stems comprises:
      a hollow stalk projecting substantially orthogonally, at a proximal end thereof, from one of said first and second surfaces; and
      a hollow head defined on a distal end of said hollow stalk,
      wherein said head comprises:
         a flange section extending from said distal end of said hollow stalk and having an outer diameter greater than an outer diameter of said hollow stalk at said distal end; and
         a cap section extending from said flange section and defining a distal end of the stem, said cap section having a generally convex contour and having:
            a first wall thickness at the distal end of said stem;
            a second wall thickness at a junction of said cap section and said flange section; and
            a third wall thickness at a circumferential section intermediate said distal end and said flange section, said third wall thickness being less than said first and second wall thicknesses, and
   wherein, when said second connector is superposed on said first article connector such that said heads of said second plurality of flexible stems are in general contact engagement with, but laterally offset from, said heads of said first plurality of flexible stems, a sub-set of stems of said first plurality of flexible stems defines a gap and accommodates a head and a stem of said second plurality of flexible stems therein upon an application of a first force in excess of a first predetermined threshold on at least one of said first and second connectors urging the at least one of said first and second connectors toward the other connector.

14. The system of claim 13, wherein said first and second pluralities of flexible stems are arranged in a square pattern, such that any four stems of any one of said first and second pluralities of flexible stems of said first and second articles define the vertices of a square, such that a central gap is defined therebetween, said central gap being adapted to receive a stem projecting from the other of said first and second pluralities of flexible stems therein.

15. The system of claim 13, wherein said first and second pluralities of flexible stems are arranged in a triangle pattern, such that any three stems of any one of said first and second pluralities of flexible stems of said first and second articles define the vertices of a triangle, such that a central gap is defined therebetween, said central gap being adapted to receive a stem projecting from the other of said first and second pluralities of flexible stems therein.

16. The system of claim 13, wherein, an application of a second force greater than a second predetermined threshold pulling at least one of said first and second connectors away from each other on at least one of said first and second connectors in a direction opposite of said first force causes said head and said stem of said second plurality of flexible stems to be released from said sub-set of said first plurality of flexible stems.

17. The system of claim 16, wherein said second predetermined threshold is greater than said first predetermined threshold.

18. The system of claim 13, wherein said first and second connectors comprise an electrically conductive material for electrical communications therebetween.

19. The system of claim 18, wherein said electrically conductive material comprises an electrically conductive coating disposed on said plurality of flexible stems.

20. The system of claim 13, wherein said first and second connectors comprise a thermally conductive material.

21. The system of claim 20, wherein said thermally conductive material comprises a thermally conductive coating disposed on said plurality of flexible stems.

22. An electrical interconnect apparatus comprising:
   a circuit board; and
   a plurality of flexible stems projecting from said circuit board, and configured to electrically interconnect with a corresponding plurality of flexible stems projecting from a component,
   wherein each of said plurality of flexible stems comprises:
      a hollow stalk projecting generally orthogonally at a proximal end thereof from said circuit board; and
      a generally convex, hollow head defined on a distal end of said stalk,
      wherein said hollow head comprises:
         a flange section extending from said distal end of said stalk and having an outer diameter greater than an outer diameter of said stalk at said distal end; and a cap section having a generally convex contour extending from said flange section, wherein a distal end of said cap section is configured to flex about a circumferential section of said cap section along a longitudinal axis of said stalk, responsive to a force acting thereon, wherein the outer diameter of said cap section increases from said circumferential section toward said flange section, defining an engagement section, and wherein said plurality of flexible stems comprises at least an electrically conductive material.

23. The apparatus of claim 22, wherein said plurality of flexible stems include an electrically conductive coating disposed thereon.

24. The apparatus of claim 22, wherein said circumferential section has a wall thickness less than a wall thickness of said cap section at any other circumferential section.

25. The apparatus of claim 24, wherein said cap section has a wall thickness at said distal end greater than said wall thickness of said circumferential section.

* * * * *